United States Patent [19]
Seki

[11] 3,988,693
[45] Oct. 26, 1976

[54] COMPLEMENTARY PUSH-PULL AMPLIFIER DEVICE WITH PROTECTIVE CIRCUIT MEANS

[75] Inventor: Kunio Seki, Kodaira, Japan

[73] Assignee: Hitachi, Ltd., Japan

[22] Filed: May 21, 1975

[21] Appl. No.: 579,592

Related U.S. Application Data
[63] Continuation of Ser. No. 413,223, Nov. 6, 1973, abandoned.

[30] Foreign Application Priority Data
Nov. 6, 1972  Japan.............................. 47-110303

[52] U.S. Cl. ............................... 330/207 P; 330/17
[51] Int. Cl.² ........................................ H03F 21/00
[58] Field of Search............... 330/13, 17, 15, 207 P

[56] References Cited
UNITED STATES PATENTS

| | | | |
|---|---|---|---|
| 3,445,776 | 5/1969 | Leidich................... | 330/15 |
| 3,529,254 | 9/1970 | Hill........................ | 330/15 |
| 3,536,958 | 10/1970 | Sondermeyer........... | 330/13 |
| 3,681,659 | 8/1972 | Suzuki.................... | 330/207 P |
| 3,786,364 | 1/1974 | Wheatley, Jr............ | 330/17 |

OTHER PUBLICATIONS
IBM Tech. Discl. Bulletin, vol. 14, No. 3, Aug. 1971, pp. 699–700 "Power Amplifier With Output Protection Circuit" by Lamoreaux.

Primary Examiner—Stanley D. Miller, Jr.
Attorney, Agent, or Firm—Craig & Antonelli

[57] ABSTRACT

In an amplifier device including a driving amplifier circuit and a push-pull output circuit, the push-pull output circuit consisting of a first amplifier portion which turns "on" when the drive current of the driving amplifier circuit decreases, and a second amplifier portion which turns "on" when the drive current increases, the improvement comprising the first protective circuit which is disposed on the input side of the first amplifier portion so as to branch an input current when the first amplifier portion falls outside its allowable operating range, and the second protective circuit which is disposed on the input side of the driving amplifier circuit so as to branch an input current when the second amplifier portion falls outside its allowable operating range, whereby even when the drive current of the driving amplifier circuit becomes large, the constituent parts of the push-pull output circuit can be reliably protected from being destroyed.

11 Claims, 4 Drawing Figures

COMPLEMENTARY PUSH-PULL AMPLIFIER DEVICE WITH PROTECTIVE CIRCUIT MEANS

This is a continuation of application Ser. No. 413,223, filed Nov. 6, 1973 and now abandoned.

BACKGROUND OF THE INVENTION

1. Field of the Invention

The present invention relates to amplifier devices. More particularly, it relates to an amplifier device which includes at least a driving amplifier circuit and a push-pull output circuit, the push-pull output circuit consisting of a first amplifier portion which turns "on" when the drive current of the driving amplifier circuit decreases, and a second amplifier portion which turns "on" when the drive current increases.

2. Description of the Prior Art

In the field of the amplifier devices of this type, many power amplifier devices recently developed have amplifier circuits which are directly coupled and employ the OTL system in order to put them into the form of integrated circuits. With such a construction, however, a great current flows through the push-pull output circuit. Therefore, a load short-circuit, for example, may result. Then, the power amplifier portions forming the push-pull output circuit fall outside the allowable operating ranges, and their constituent components are therefore destroyed.

In an example of a measure for solving such a problem, when the first and second power amplifier portions fall out of the allowable operating ranges, changes in the voltage and current on their output side are detected. The respective inputs of the first and second amplifier portions are adjusted on the basis of the detection, whereby the operations of the amplifier portions are controlled. The circuit thus far described is shown in a Japanese technical periodical "Denshi-Gijutsu (Electronics)," No. 2, Vol. 14, 1972, FIG. 6, in a paper entitled 'Circuit Design viewed from Protecting System' on pp. 34 – 39.

With such a construction, the destruction of the transistors of the first and second amplifier portions due to overloads for the first and second amplifier portions, or due to an abnormal rise in the supply voltage, can be prevented. However, in the case of overloads, for example, the drive current at the output of the driving amplifier circuit becomes large. It is accordingly feared that the transistor constituting the driving amplifier circuit will fall into an overloaded state, leading to its destruction.

In order to solve the problem, a circuit has been proposed in which the input of the driving amplifier circuit is adjusted at the overload condition. With any of such constructions, however, protective circuits are so arranged as to separately control the input sides of the respective constituent parts. As a consequence, the required number of components is large, and the structure is complicated.

Besides, in the prior-art constructions, the transistors of the protective circuits disposed on the input sides of the first and second amplifier portions differ in type. For example, when a P-N-P transistor is used on the input side of the first amplifier portion, an N-P-N transistor is employed on the input side of the second amplifier portion. Accordingly, in the case where the power amplifier device of such construction is to be produced in the form of an integrated circuit, it is required to make either of them in the lateral structure and the other in the vertical structure. This is undesirable from the point of view of raising the degree of integration.

SUMMARY OF THE INVENTION

It is therefore the principal object of the present invention to provide an amplifier device of simple construction in which, even when the drive current of the driving amplifier circuit for driving a push-pull output circuit becomes large, the output transistors of the push-pull output circuit can be reliably protected.

Another object of the present invention is to provide an amplifier device which has a protecting function suitable for integrating a push-pull output circuit.

Still another object of the present invention is to provide an amplifier device which can reliably protect the transistors of a push-pull output circuit with a small current.

Yet another object of the present invention is to provide an amplifier device which can use a driving amplifier circuit having a high voltage gain.

In order to accomplish such objects, the present invention provides a protective circuit on the input side of a driving amplifier circuit so that, when the second amplifier portion falls out of the operating range, its output may be controlled.

PREFERRED EMBODIMENTS OF THE INVENTION

Figure 1:
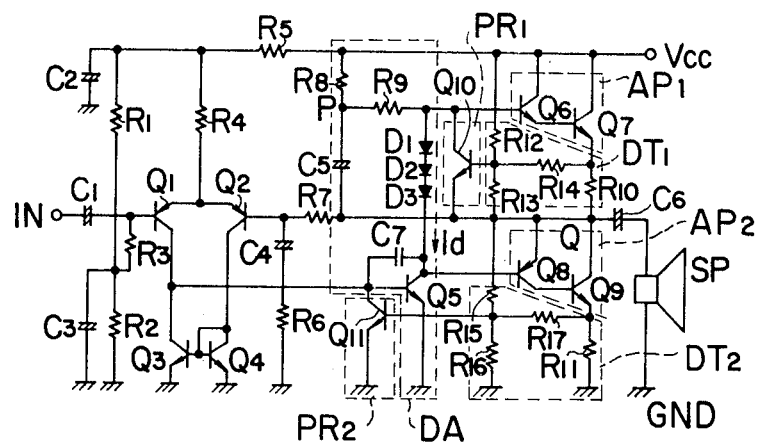
FIGS. 1 to 4 are schematic circuit diagrams each showing an embodiment of the amplifier device according to the present invention.

FIG. 1 shows a power amplifier device which is an embodiment of the amplifier device according to the present invention. In the figure, $Q_1 - Q_{11}$ designate transistors, among which the transistors $Q_1$, $Q_2$ and $Q_8$ are of the P-N-P type, and the other transistors are of the N-P-N type. $R_1 - R_{17}$ indicate resistances, $C_1 - C_7$ capacitors, $D_1 - D_3$ diodes, IN an input terminal, $V_{cc}$ a power source terminal, and SP a speaker.

The transistors $Q_1$ and $Q_2$ have their emitters connected in common. The transistors $Q_3$ and $Q_4$ are so connected as to constitute constant-current loads of the transistors $Q_1$ and $Q_2$. These components form a differential amplifier along with the resistance $R_4$, and perform a pre-amplification function. The transistors $Q_6$ and $Q_7$ and transistors $Q_8$ and $Q_9$ are in the Darlington connection, respectively. The transistors $Q_6 - Q_9$ constitute a complementary push-pull output circuit. The base of the transistor $Q_6$ is connected through the resistance $R_9$ and $R_8$ to the power source terminal $V_{cc}$, while the base of the transistor $Q_8$ is directly connected to the collector of the transistor $Q_5$ performing a driving amplification function. The emitter of the transistor $Q_7$ is connected through the resistance $R_{10}$ to the collector of the transistor $Q_9$, while the emitter of the transistor $Q_9$ is grounded through resistance $R_{11}$. As regards the transistor $Q_5$, the collector is connected to the base of the transistor $Q_6$ through the diodes $D_1 - D_3$ for supplying an idling current, the emitter is grounded, and the base is connected to the collector of the transistor $Q_1$ constituting a part of the aforesaid differential amplifier. Between the juncture P of the resistances $R_8$ and $R_9$ and the juncture Q of the resistance $R_{10}$ and the transistor $Q_9$, there is connected a capacitor $C_5$, which constitutes a bootstrap circuit along with the resistances $R_8$ and $R_9$.

The transistors $Q_{10}$ and $Q_{11}$ are transistors which constitute ASO detection type protective circuits, which are the characterizing feature of the present invention. The transistor $Q_{10}$ has its collector connected to the base of the transistor $Q_6$, has its emitter connected to the juncture Q, and has its base connected through the resistance $R_{14}$ to the emitter of the transistor $Q_7$. The base of the transistor $Q_{10}$ is connected to the juncture of the resistance $R_{12}$ and $R_{13}$ being connected in series between the power source terminal $V_{cc}$ and the juncture Q, and thus receives a predetermined bias. The transistor $Q_{11}$ has its collector connected to the base of the transistor $Q_5$, has its emitter grounded, and has its base connected through the resistance $R_{17}$ to the emitter of the transistor $Q_9$. The base of the transistor $Q_{11}$ is connected to the juncture of the resistances $R_{15}$ and $R_{16}$ being connected in series between the juncture Q and ground, and thus receives a predetermined bias. The capacitor $C_7$ interposed between the collector and base of the transistor $Q_5$ is for phase compensation. The resistances $R_6$ and $R_7$ and the capacitor $C_7$ constitute a negative feedback circuit.

In this circuit configuration, transistor $Q_5$, resistances $R_8$ and $R_9$, diodes $D_1$–$D_3$, and capacitors $C_5$ and $C_7$ constitute a driving amplifier circuit DA; transistors $Q_6$ and $Q_7$ constitute a first amplifier portion $AP_1$; and transistors $Q_8$ and $Q_9$ constitute a second amplifier portion $AP_2$. Resistances $R_{10}$, $R_{12}$, $R_{13}$ and $R_{14}$ constitute a first detecting circuit $DT_1$; resistances $R_{11}$, $R_{15}$, $R_{16}$ and $R_{17}$ constitute a second detecting circuit $DT_2$; transistor $Q_{10}$ constitutes a first protective circuit means $PR_1$; and transistor $Q_{11}$ constitutes a second protective circuit means $PR_2$. The base of the transistor $Q_5$ acts as an input of the driving amplifier circuit DA, a juncture of the resistance $R_9$ and diode $D_1$ acts as a first output of the driving amplifier circuit DA, and the collector $Q_5$ acts as a second output of the driving amplifier circuit DA. The bases of the transistors $Q_6$ and $Q_8$ act as inputs of the first and second amplifier portions $AP_1$ and $AP_2$, respectively. The first detecting circuit $DT_1$ is connected in series with the first amplifier portion $AP_1$ between a first d.c. voltage source Vcc and an output juncture Q of the push-pull output circuit. The second detecting circuit $DT_2$ is connected in series with the second amplifier portion $AP_2$ between the output juncture Q of the push-pull output circuit and a second d.c. voltage source GND.

The first and second detecting circuits $DT_1$ and $DT_2$ detect the output current and the voltage drop of the first and second amplifier portions $AP_1$ and $AP_2$, and generate first and second detected signals at the junctures of resistances $R_{12}$ and $R_{13}$, and $R_{15}$ and $R_{16}$, respectively.

The first protective circuit means $PR_1$ is connected to the input of the first amplifier portion $AP_1$, and the second protective circuit means $PR_2$ is connected to the input of the driving amplifier circuit DA.

When, for example, the speaker SP, serving as the load of this device, is short-circuited under such a construction, the transistors $Q_{10}$ and $Q_{11}$ having the protecting function operate as described below.

When the input of the transistor $Q_5$ decreases and the collector current (drive current) $I_d$ of this transistor decreases, the base potential of the transistor $Q_6$ rises. Accordingly, the transistor $Q_6$ and the transistor $Q_7$ become more saturated. The emitter output current of the transistor $Q_7$ increases, so that the base potential of the transistor $Q_{10}$ rises. Thus, the base current of the transistor $Q_6$ can be controlled with the collector current of the transistor $Q_{10}$.

When the input of the transistor $Q_5$ increases and the drive current $I_d$ of this transistor increases, the base potential of the transistor $Q_8$ lowers. Accordingly, the transistor $Q_8$ and the transistor $Q_9$ reach a more saturated state, to increase the emitter output current of the transistor $Q_9$. Therefore, the base potential of the transistor $Q_{11}$ rises. Consequently, the transistor $Q_{11}$ starts conducting, and the base current of the transistor $Q_5$ can be controlled with the collector current of the transistor $Q_{11}$. In this case, the transistor $Q_{11}$ need adjust only as small a current as $1/h_{FE}$ ($h_{FE}$: the current amplification factor of the transistor $Q_5$) of the drive current $I_d$. The collector potential of the transistor $Q_5$ can be sufficiently controlled, and the protecting operation can be reliably effected. Accordingly, such a construction makes it unnecessary to separately incorporate protective circuits onto the input sides of the respective constituent parts as in the prior art.

With such a construction, the transistors $Q_{10}$ and $Q_{11}$ may be of the same type. Moreover, they are of the N-P-N type. It is therefore unnecessary to employ the transistor of the lateral structure as in the prior art. Since the transistors of the vertical structure can be used as the protective circuits, the current amplification factor can be made comparatively large. Accordingly, control signals which serve as inputs to the protective circuits may be small.

That is, even in the case where, in order to enhance the voltage gain of the amplifier device, the emitter resistance of the transistor $Q_5$ is made small (it need not be incorporated) and the drive current is made very large for the current drive, the protecting operation can be securely performed.

Figure 2:
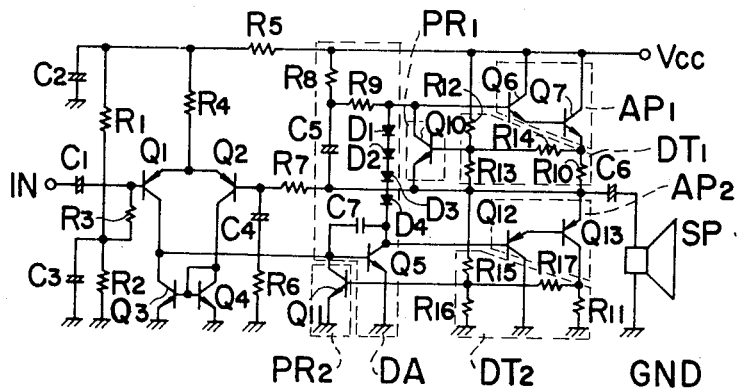

FIG. 2 shows another embodiment of the amplifier device according to the present invention. A point of difference from the embodiment in FIG. 1 is that the push-pull output circuit is of the pure complementary type. In the figure, $Q_{12}$ and $Q_{13}$ indicate P-N-P transistors, which are in the pure complementary connection with the transistors $Q_6$ and $Q_7$. $D_4$ designates a diode.

With such a construction, the transistors $Q_{10}$ and $Q_{11}$ perform the protecting operation similar to that in the embodiment in FIG. 1.

Figure 3:
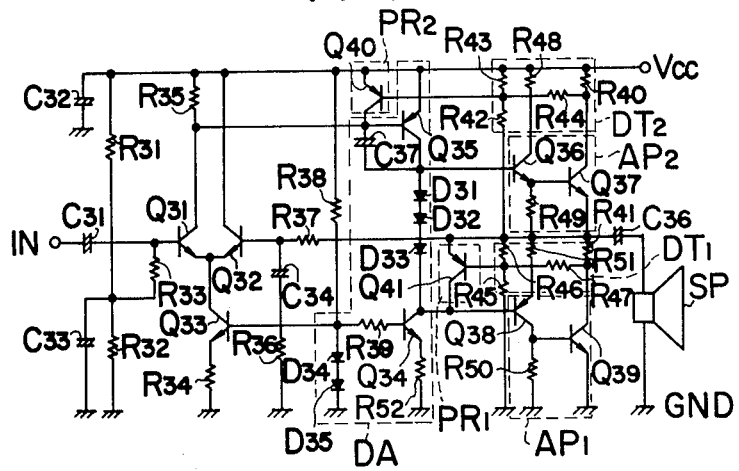

FIG. 3 shows a power amplifier device which is another embodiment of the amplifier device according to the present invention. In the figure, $Q_{31}$ – $Q_{41}$ represent transistors, among which the transistors $Q_{35}$, $Q_{38}$, $Q_{40}$ and $Q_{41}$ are of the P-N-P type and the transistors $Q_{31}$ – $Q_{34}$, $Q_{36}$, $Q_{37}$ and $Q_{39}$ are of the N-P-N type. $R_{31}$ – $R_{52}$ designate resistances, $C_{31}$ – $C_{37}$ capacitors, and $D_{31}$ – $D_{35}$ diodes.

The transistors $Q_{31}$ and $Q_{32}$ have their emitters connected in common. The transistors $Q_{33}$ has its collector connected to the commonly connected emitters, and has its emitter grounded through the resistance $R_{34}$. The collector of the transistor $Q_{31}$ is connected through the resistance $R_{35}$ to a power source terminal $V_{cc}$, while the collector of the transistor $Q_{32}$ is directly connected to the power source terminal $V_{cc}$. The resistances $R_{31}$ – $R_{33}$ serve to determine the base bias of the transistor $Q_{31}$. The resistance $R_{38}$ and the diodes $D_{34}$, $D_{35}$ are connected in series between the power source terminal $V_{cc}$ and ground, and drive as a constant-current source the transistor $Q_{33}$ whose base is connected to the juncture between the resistance $R_{38}$ and the diode $D_{34}$. These components constitute a differential amplifier, and perform a pre-amplification function.

The transistors $Q_{36}$ and $Q_{37}$ and transistors $Q_{38}$ and $Q_{39}$ are connected so as to constitute a complementary push-pull circuit. The collector of the transistor $Q_{37}$ is connected through the resistance $R_{40}$ to the power source terminal $V_{cc}$. The emitter of the transistor $Q_{38}$ and the collector of the transistor $Q_{39}$ are connected through the resistances $R_{51}$ and $R_{41}$ to the emitter of the transistor $Q_{37}$, respectively. The emitter of the transistor $Q_{36}$ is connected through the resistance $R_{49}$ to the emitter of the transistor $Q_{37}$, the collector of the transistor $Q_{38}$ is grounded through the resistance $R_{50}$, and the emitter of the transistor $Q_{39}$ is directly grounded.

The transistor $Q_{35}$ performs a driving amplification function for the foregoing push-pull output circuit. It has its emitter connected to the power source terminal $V_{cc}$, its collector connected to the collector of the transistor $Q_{34}$ through the diodes $D_{31} - D_{33}$ for supplying an idling current, and its base connected to the collector of the transistor $Q_{31}$. The emitter of the transistor $Q_{34}$ is grounded through the resistance $R_{52}$, while the base is connected through the resistance $R_{39}$ to the juncture between the resistance $R_{38}$ and the diode $D_{34}$. Accordingly, the transistor $Q_{34}$ is adapted to operate as a constant-current source.

The transistors $Q_{40}$ and $Q_{41}$ form ASO detection type protective circuits which constitute the characterizing feature of the present invention. As regards the transistor $Q_{40}$, its emitter is connected to the power source terminal $V_{cc}$, its collector is connected to the base of the transistor $Q_{35}$, and its base is connected through the resistance $R_{44}$ to the collector of the transistor $Q_{37}$. As regards the transistor $Q_{41}$, its emitter is connected to the emitter of the transistor $Q_{37}$, its collector is connected to the base of the transistor $Q_{38}$, and its base is connected through the resistance $R_{47}$ to the collector of the transistor $Q_{39}$. The base of the transistor $Q_{40}$ is connected to the juncture between the resistances $R_{43}$ and $R_{42}$ being connected in series between the power source terminal $V_{cc}$ and the emitter of the transistor $Q_{37}$, while the base of the transistor $Q_{41}$ is connected to the juncture between the resistance $R_{46}$ and $R_{45}$ being connected in series between the emitter of the transistor $Q_{37}$ and ground. Thus, the bases of the transistors $Q_{40}$ and $Q_{41}$ receive predetermined biases. The capacitor $C_{37}$ incorporated between the base and collector of the transistor $Q_{35}$ is for phase compensation. The resistances $R_{37}$ and $R_{36}$ and the capacitor $C_{34}$ constitute a negative feedback circuit.

With such a construction, the transistors $Q_{36}$ and $Q_{37}$ are rendered conductive when the drive current of the transistor $Q_{35}$ becomes large. Therefore, the transistor $Q_{40}$ can branch the base current of the transistor $Q_{35}$ in dependence on the variation of the drive current. Accordingly, the operation of the transistor $Q_{40}$, the operation of the transistor $Q_{41}$ and the effect thereby attained are similar to those in the case of FIG. 1, and therefore the detailed explanation is omitted.

Figure 4:
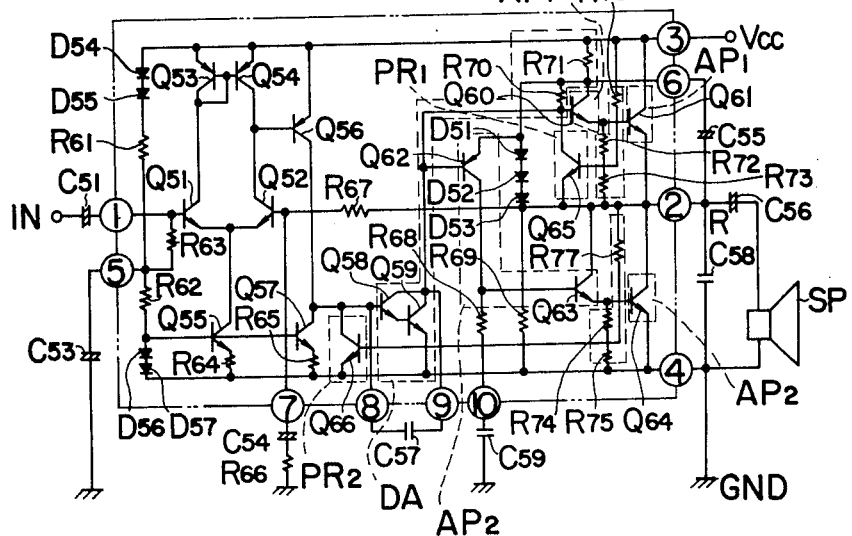

FIG. 4 shows a power amplifier device which is a further embodiment of the amplifier device according to the present invention. Particularly, it illustrates a different ASO detection type for the protective circuitry.

In the figure, $Q_{51} - Q_{66}$ designate transistors, among which transistors $Q_{53}$, $Q_{54}$, $Q_{56}$ and $Q_{62}$ are of the P-N-P type and transistors $Q_{51}$, $Q_{52}$, $Q_{55}$, $Q_{57} - Q_{61}$ and $Q_{63} - Q_{66}$ are of the N-P-N type. $R_{61} - R_{77}$ indicate resistances, $C_{51} - C_{59}$ capacitors, and $D_{51} - D_{57}$ diodes.

The transistors $Q_{51}$ and $Q_{52}$ are emitter-coupled. On the collector side, the transistors $Q_{53}$ and $Q_{54}$ are connected so as to constitute a constant-current load. Connected to the coupled emitters is a series circuit consisting of the transistor $Q_{55}$ and the resistance $R_{64}$, the former of which has the base bias determined by the diodes $D_{54} - D_{57}$ and the resistances $R_{61}$ and $R_{62}$. These components constitute a differential amplifier, performing a pre-amplification function.

The transistor $Q_{56}$ performs a level shift function. It has its base connected to the collector of the transistor $Q_{52}$, has its emitter connected to a power source terminal $V_{cc}$, and has its collector connected to a series circuit consisting of the resistance $R_{65}$ and the transistor $Q_{57}$ whose base bias is determined by the same means as in the foregoing transistor $Q_{55}$.

The transistors $Q_{60}$ and $Q_{61}$ and transistors $Q_{62}$, $Q_{63}$ and $Q_{64}$ constitute a push-pull output circuit. The transistors $Q_{58}$ and $Q_{59}$ are in the Darlington connection, and constitute a driving amplifier circuit.

The transistors $Q_{65}$ and $Q_{66}$ constitute protective circuits, respectively. The transistor $Q_{65}$ has its collector connected to the base of the transistor $Q_{60}$, has its emitter connected to the juncture R between the emitter of the transistor $Q_{61}$ and the collector of the transistor $Q_{64}$, and has its base connected through the resistance $R_{72}$ to the emitter of the transistor $Q_{60}$ and the base of the transistor $Q_{61}$. In this case, the base of the transistor $Q_{65}$ is connected to the juncture of the resistances $R_{76}$ and $R_{73}$ connected in series between the power source terminal $V_{cc}$ and the juncture R, and thus receives a predetermined base bias. On the other hand, the transistor $Q_{66}$ has its collector connected to the base of the transistor $Q_{58}$ performing a driving amplification function, has its emitter grounded, and has its base connected through the resistance $R_{74}$ to the emitter of the transistor $Q_{63}$ and the base of the transistor $Q_{64}$. The base of the transistor $Q_{66}$ is connected to the juncture of the resistances $R_{77}$ and $R_{75}$ connected in series between the juncture R and ground, and thus receives a predetermined base bias.

Also with such a construction, the transistors $Q_{62} - Q_{64}$ are rendered conductive when the drive current of the transistors $Q_{58}$ and $Q_{59}$ become large. Therefore, the transistor $Q_{36}$ can adjust the base current of the transistor $Q_{58}$ in dependence on the variation of the drive current. The other operations and the effect thereby accomplished are the same as in the foregoing cases. In FIG. 4, the part enclosed by dotted lines is constructed of an integrated circuit. Numerals enclosed with circles indicate terminal numbers.

In this circuit configuration, transistors $Q_{58}$ and $Q_{59}$, and resistances $R_{70}$ and $R_{71}$ constitute the driving amplifier circuit DA; transistors $Q_{60}$ and $Q_{61}$ constitute the first amplifier portion $AP_1$; and transistors $Q_{62}$, $Q_{63}$ and $Q_{64}$ constitute the second amplifier portion $AP_2$. Resistances $R_{72}$, $R_{73}$ and $R_{76}$ constitute the first detecting circuit $DT_1$; resistances $R_{74}$, $R_{75}$ and $R_{77}$ constitute the second detecting circuit $DT_2$; transistor $Q_{65}$ constitutes the first protective circuit means $PR_1$, and transistor $Q_{66}$ constitutes the second protective circuit means $PR_2$.

The base and the collector of the transistor $Q_{58}$ act as the input and the output of the driving amplifier circuit DA, respectively.

Although, in the foregoing embodiments, the present invention is applied to the push-pull output circuits of the Darlington complementary type, it may of course be applied to those of the mere complementary type.

Although, in the embodiments described herein, the driving amplifier circuits are of the current drive type, they may of course be of the voltage drive type.

Although, in the embodiments, the protective circuits are of the ASO detection type, they may of course be of the current limit type. In this case, the first and second detecting circuits detect only the output current of the first and second amplifier portion. For example, in FIG. 1, the first and second detecting circuits consist of resistance $R_{10}$ and $R_{11}$, respectively.

Although, in any of the embodiments, the present invention is applied to a power amplifier device, it may be applied to general amplifier circuits, such as an operational amplifier device for industry.

As described above, in accordance with the amplifier device of the present invention, even when the drive current of the driving amplifier circuit is large, the transistors of the push-pull output circuit can be reliably protected with a circuit of simple construction. Since all the transistors for protecting the transistors of the push-pull output circuit can be made in the same type, the integration of the device is facilitated. In accordance with the present invention, the transistors of the push-pull output circuit can be reliably protected with small currents, so that the integration of the device is facilitated. In accordance with the present invention, the voltage gain of the driving amplifier circuit can be made high.

While I have shown and described several embodiments in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What I claim is:

1. In a complementary push-pull amplifier device with protective circuit means including at least a driving amplifier circuit and a push-pull output circuit connected to the output of said driving amplifier circuit, the push-pull output circuit consisting of a first amplifier portion and a second amplifier portion, wherein inputs of said first and second amplifier portions are respectively connected to the output of said driving amplifier circuit, so that said first amplifier portion is rendered conductive and said second amplifier portion is rendered non-conductive respectively when the drive current of said driving amplifier circuit decreases, and said first amplifier portion is rendered non-conductive and said second amplifier portion is rendered conductive when the drive current of said driving amplifier circuit increases, the improvement comprising:

a first detecting circuit connected in series with said first amplifier portion between a first d.c. voltage source and an output juncture of said push-pull output circuit;

a second detecting circuit connected in series with said second amplifier portion between said output juncture of said push-pull output circuit and a second d.c. voltage source;

first protective circuit means, connected to the input of said first amplifier portion and responsive to a first detected signal of said first detecting circuit, for controlling the input of said first amplifier portion, when said first amplifier portion falls out of its allowable operating range; and second protective circuit means, connected to the input of said driving amplifier circuit and responsive to a second detected signal of said second detecting circuit, for controlling the input of said second amplifier portion when said second amplifier portion falls out of its allowable operating range.

2. A complementary push-pull amplifier device with protective circuit means as defined in claim 1, wherein said first and second amplifier portions each comprises a respective pair of transistors in the Darlington connection.

3. A complementary push-pull amplifier device with protective circuit means as defined in claim 1, wherein said first and second amplifier portions each comprise a respective pair of transistors of the complementary type.

4. A complementary push-pull amplifier device with protective circuit means as defined in claim 1, wherein said first protective circuit means comprises a first transistor connected between the input of said first amplifier portion and said output juncture of said push-pull circuit, and said second protective circuit means comprises a second transistor connected between the input of said driving amplifier circuit and said second d.c. voltage source.

5. A complementary push-pull amplifier device with protective circuit means as defined in claim 4, further including a differential amplifier circuit connected to the input of said driving amplifier circuit.

6. A complementary push-pull amplifier device with protective circuit means as defined in claim 4, wherein a constant current source is connected to the output of said driving amplifier circuit which is connected to the inputs of said first and second amplifier portions.

7. A complementary push-pull amplifier device with protective circuit means as defined in claim 6, further including a differential amplifier circuit connected to the input of said driving amplifier circuit.

8. A complementary push-pull amplifier device with protective circuit means as defined in claim 4, wherein said driving amplifier circuit comprises a pair of transistors connected in Darlington configuration.

9. A complementary push-pull amplifier device with protective circuit means as defined in claim 8, wherein a level shift circuit is connected to the input of said driving amplifier circuit.

10. A complementary push-pull amplifier device as defined in claim 1, wherein each one of said driving amplifier circuit and said first amplifier portion comprises at least one transistor of a first conductivity type, and said second amplifier portion comprises at least one transistor of a second conductivity type, opposite said first conductivity type.

11. A complementary push-pull amplifier device as defined in claim 10, wherein each of said first and second protective circuit means comprises at least one transistor of said first conductivity type.

* * * * *